United States Patent
Zhang et al.

(10) Patent No.: US 7,531,398 B2
(45) Date of Patent: May 12, 2009

(54) METHODS AND DEVICES EMPLOYING METAL LAYERS IN GATES TO INTRODUCE CHANNEL STRAIN

(75) Inventors: Zhibo Zhang, Plano, TX (US); Cloves Rinn Cleavelin, Dallas, TX (US); Michael Francis Pas, Richardson, TX (US); Stephanie Watts Butler, Richardson, TX (US); Mike Watson Goodwin, Murphy, TX (US); Satyavolu Srinivas Papa Rao, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 73 days.

(21) Appl. No.: 11/583,280

(22) Filed: Oct. 19, 2006

(65) Prior Publication Data

US 2008/0096338 A1 Apr. 24, 2008

(51) Int. Cl.
*H01L 21/336* (2006.01)
*H01L 21/8234* (2006.01)

(52) U.S. Cl. ............... 438/197; 438/680; 438/679; 438/684; 257/E21.17; 257/E21.051; 257/E21.278; 257/E21.267; 257/E21.435

(58) Field of Classification Search ............... 438/197, 438/199, 257, 258, 259, 297, 300, 679, 680, 438/700, 723, 743, 756, 933
See application file for complete search history.

(56) References Cited

U.S. PATENT DOCUMENTS

| | | | |
|---|---|---|---|
| 2006/0071285 A1* | 4/2006 | Datta et al. ............... 257/407 |
| 2006/0151808 A1* | 7/2006 | Chen et al. ............... 257/188 |
| 2007/0257308 A1* | 11/2007 | Lee et al. ............... 257/334 |
| 2007/0296039 A1* | 12/2007 | Chidambarrao et al. ..... 257/355 |

\* cited by examiner

*Primary Examiner*—David Nhu
(74) *Attorney, Agent, or Firm*—Wade J. Brady III; Frederick J. Telecky, Jr.

(57) ABSTRACT

A semiconductor device is fabricated having a metal stress inducing layer that facilitates channel mobility. A gate dielectric layer is formed over a semiconductor substrate. The metal stress inducing layer is formed over the gate dielectric layer. The metal stress inducing layer has a selected conductivity type and is formed and composed to yield a select stress amount and type. A gate layer, such as a polysilicon layer, is formed over the metal stress inducing layer. The gate layer and the metal stress inducing layer are patterned to define gate structures.

29 Claims, 5 Drawing Sheets

METHODS AND DEVICES EMPLOYING METAL LAYERS IN GATES TO INTRODUCE CHANNEL STRAIN

FIELD OF INVENTION

The present invention relates generally to semiconductor devices and, more particularly, to methods and devices that employ metal layers to introduce channel strain.

BACKGROUND OF THE INVENTION

Semiconductor devices typically include MOS transistors for switching, amplification, and other functions. Current trends in the semiconductor industry include faster switching speeds, reduced power consumption, and lower operating voltages, wherein the performance of MOS transistors needs to be correspondingly improved. For example, high-speed transistors are required for modern wireless communications systems, portable computers, and other low-power, low-voltage devices, wherein MOS transistors must be adapted to operate at lower voltages using less power.

The carrier mobility in a MOS transistor has a significant impact on power consumption and switching performance. The carrier mobility is a measure of the average speed of a carrier (e.g., holes or electrons) in a given semiconductor, given by the average drift velocity of the carrier per unit electric field. Improving the carrier mobility can improve the switching speed of a MOS transistor, and can also facilitate operation at lower voltages, alone or in combination with reducing the transistor channel length and gate dielectric thickness to improve current drive and switching performance.

Carrier mobility of a MOS transistor is affected by the mechanical stress in the device channel. The carrier mobility can be improved by depositing silicon/germanium alloy or other material layers in source/drain regions, in order to enhance hole carrier mobility in a channel region. For NMOS transistors, tensile stress in the channel material improves carrier mobility by lifting conduction band degeneracy.

One mechanism to improve channel mobility is to form a stress inducing layer that induces a desired stress. The stress inducing layer is formed after forming gate structures and attempts to induce stress into channel regions of the devices. However, as device sizes continue to shrink, the effectiveness of such stress inducing layers is reduced.

Thus, there is a need for methods and apparatus by which the carrier mobility and other electrical operational properties of MOS transistor devices may be improved so as to facilitate improved switching speed and low-power, low-voltage operation, without significantly adding to the cost or complexity of the manufacturing process.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

Aspects of the present invention employ stress inducing metal within their gate structures. The metal layer is part of a gate and induces stress in the channel region of transistor devices in order to facilitate channel mobility. The proximity of the metal layer to the channel region facilitates the inducement of stress and can improve device performance and permit further scaling.

In accordance with one aspect of the invention, a method of fabricating a semiconductor device is disclosed. A semiconductor substrate is provided. A gate dielectric layer is formed over the semiconductor substrate. A gate metal stress inducing layer is formed over the gate dielectric layer. A gate layer is formed over the gate metal stress inducing layer. The gate metal stress inducing layer and the gate layer are patterned to define a gate structure. Sidewall spacers are formed on lateral edges of the gate structure. Source/drain regions are formed within the substrate on sides of the gate structure.

In accordance with another aspect of the invention, a method of forming a semiconductor device is disclosed. A replaceable gate dielectric layer is formed over a semiconductor substrate. A replaceable gate layer is formed over the replaceable gate dielectric layer. The replaceable gate layer is patterned to form a gate structure. Source/drain regions are formed within the semiconductor substrate. A planar dielectric fill layer is formed over the device. The replaceable gate layer is removed from the gate structure. The replaceable gate dielectric layer is removed from the gate structure. A gate dielectric layer is formed on interior surfaces of the gate structure. A gate metal stress inducing layer is formed on interior bottom and vertical surfaces of the gate structure. Vertical portions of the gate metal stress inducing layer are removed. A fill layer is formed to fill in remaining recessed portions of the gate stack. Other methods and devices are disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

One or more implementations of the present invention will now be described with reference to the attached drawings, wherein like reference numerals are used to refer to like elements throughout, and wherein the illustrated structures are not necessarily drawn to scale.

The various aspects of the invention employ one or more stress inducing metal gate layers to facilitate channel mobility for transistor devices. The metal gate layers are part of gate structures and can be individually tailored to induce tensile strain for NMOS devices and compress strain for PMOS devices. By facilitating channel mobility, other device performance characteristics can be improved such as, improved switching speed and low-power and the like.

The inventors of the present invention note that pre-metal deposition (PMD) liners can be employed to induce strain into channel regions of transistor devices and, thereby, facilitate channel mobility. PMD liners are formed over gate structures and are typically annealed in order to induce strain into the channel regions. However, PMD liners become less effective as device sizes shrink because of a reduced pitch size from gate to gate of transistor devices, such as CMOS devices. Similarly, the reduced pitch size also mitigates formation of relatively thick PMD liners. Additionally, such PMD liners are required to induce strain through several layers before inducing strain into channel regions, which also limits their effectiveness.

The inventors of the present invention also note that recessed source/drain regions can be formed and filled with a stress inducing material to induce stress into channel regions. For example, SiGe epi layers can be employed in recessed regions to induce stress into channel regions. However, such techniques become less effective as devices shrink due to reduced source/drain volumes.

Figure 1:
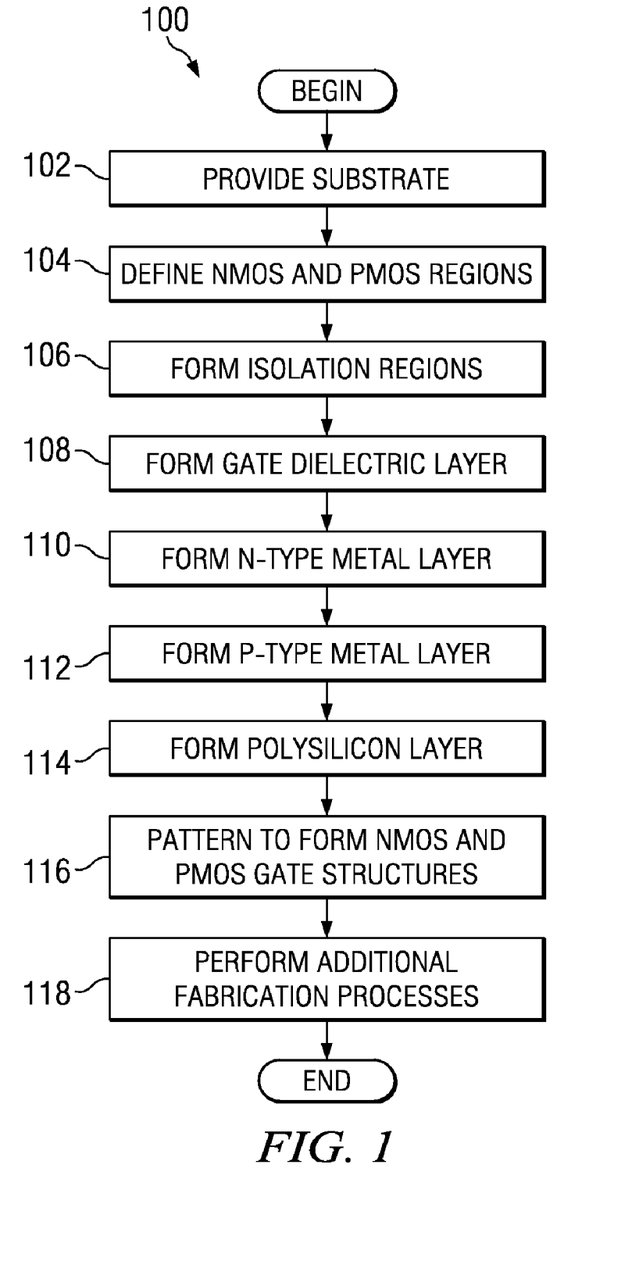
FIG. 1 is a flow diagram illustrating an exemplary method of fabricating a gate first semiconductor device in accordance with an aspect of the present invention.

Turning now to FIG. 1, is a flow diagram illustrating a method 100 of fabricating a gate first semiconductor device in accordance with an aspect of the present invention. The method 100 forms a CMOS device that includes an n-type metal stress inducing layer for an NMOS region and a p-type metal stress inducing layer for a PMOS region in order to selectively induce channel strain and facilitate channel mobility.

The method 100 begins at block 102 wherein a semiconductor substrate is provided. The semiconductor substrate is comprised of a semiconductor material, such as silicon and can be comprised of one or more layers.

NMOS and PMOS regions of the semiconductor substrate are defined at block 104. The NMOS regions are targeted for formation of NMOS devices and the PMOS regions are targeted for formation of PMOS devices.

Isolation regions are formed at block 106 by isolation processing. The isolation structures are comprised of a suitable insulative material, such as silicon dioxide. Some examples of suitable isolation structures include LOCOS regions, shallow trench isolation (STI) regions and the like. Additionally, prospective channel regions and/or well regions of the semiconductor substrate may be initially doped to adjust the prospective transistor work functions, to suppress punch-through, etc.

A gate dielectric layer is formed over the semiconductor substrate at block 108. The gate dielectric layer has a selected thickness and is comprised of a suitable dielectric material, such as silicon dioxide, nitrided silicon dioxide, high-k dielectric materials, and the like.

An n-type metal stress inducing layer is formed at least within the NMOS region over the gate dielectric layer at block 110. The n-type metal stress inducing layer is comprised of a metal material that typically has a lower work function, and, as a consequence, readily gives up electrons. Additionally, the metal material can be selected so as to resist altering of its work function at high temperatures. The n-type metal stress inducing layer is formed by a suitable deposition process, such as physical vapor deposition (PVD), chemical vapor deposition (CVD), sputtering, atomic layer deposition (ALD), and the like. Further, the n-type metal layer can comprise one or more individual layers. The stress induced by the metal layer is a function of a number of parameters including, but not limited to, deposition process, deposition process parameters, precursor, thickness, composition, and the like. In one example, the n-type metal layer is formed with a thickness of about 5 to 20 nm, however other suitable thicknesses can be employed. Generally, the n-type metal layer is formed so as to induce tensile stress in underlying channel regions of the NMOS region. Exemplary types of n-type metal layers include, but are not limited to, Al, Ta, Sr, V, Ti, TaC and TiN.

Similarly, a p-type metal stress inducing layer is formed at least within the PMOS region over the gate dielectric layer at block 112. The p-type metal stress inducing layer is comprised of a metal material that typically has a higher work function, and, as a consequence, does not readily gives up electrons. Additionally, the metal material can be selected so as to resist altering of its work function at high temperatures. The p-type metal stress inducing layer is formed by a suitable deposition process, such as physical vapor deposition (PVD), chemical vapor deposition (CVD), sputtering, atomic layer deposition (ALD), and the like. Further, the p-type metal layer can comprise one or more individual layers. The stress induced by the metal layer is a function of a number of parameters including, but not limited to, deposition process, deposition process parameters, precursor, thickness, composition, and the like. In one example, the p-type metal layer is formed with a thickness of about 5 to 20 nm, however other suitable thicknesses can be employed. Generally, the p-type metal layer is formed so as to induce compressive stress in underlying channel regions of the PMOS region. Exemplary types of p-type metal layers include, but are not limited to, Ru, W, Co, Pb, Ni, Ir and Pt.

It is appreciated that alternate aspects of the invention contemplate forming one or both of the metal stress inducing layers across both NMOS and PMOS regions. In such instances, a separate patterning process can, but not necessarily, be performed to selectively remove portions of one or both of the metal stress inducing layers.

A polysilicon layer is formed over the device, including the n-type and p-type metal stress inducing layers, at block 114. The polysilicon layer is deposited by a suitable process. Thereafter, a patterning process is performed at block 116 to form NMOS and PMOS gate structures. The patterning process selectively removes portions of the polysilicon layer and n-type metal stress inducing layer within the NMOS region and the polysilicon layer and p-type metal stress inducing layer within the PMOS region. Within the NMOS region, the NMOS gate structures/electrodes comprise the n-type metal stress inducing layer and the polysilicon layer as gate electrodes. Within the PMOS region, the PMOS gate structures/electrodes comprise the p-type metal stress inducing layer and the polysilicon layer as gate electrodes.

Additional fabrication processes are performed at block 118 to complete fabrication of the device. The additional fabrication processes can include lightly doped drain regions (LDD), highly doped drain regions (HDD), sidewall structures, source/drain implants and formation, activation anneals, PMD liners, and the like. For example, one or more stress inducing layers can be formed to counteract or increase stress induced by the n-type and p-type metal stress inducing layers. As another example, sidewall spacers can be formed along lateral edges of the gate structures. The sidewall spacers can be comprised of a suitable material, including, but not limited to silicon nitride, silicon oxide, and/or combinations thereof.

FIGS. 2A to 2F illustrate example stages of fabrication of a gate first device 200 fabricated in accordance with an aspect of the present invention. The device 200 can, for example, be fabricated at least partially according to the method 100 of FIG. 1 and/or variations thereof. The figures are provided as an example and for illustrative purposes.

Figure 2A:
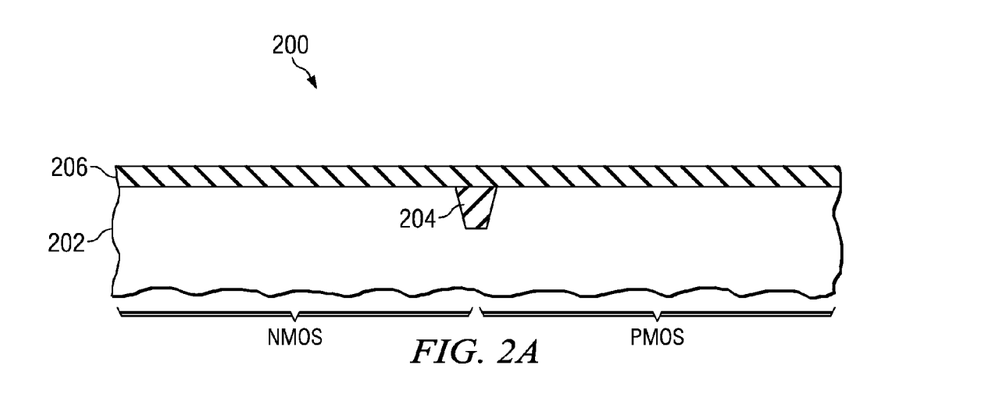
FIGS. 2A to 2F illustrate example stages of fabrication of a gate first device fabricated in accordance with an aspect of the present invention.

FIG. 2A is a cross sectional view of the device 200 at a stage of fabrication in accordance with an aspect of the present invention. At this stage, a semiconductor substrate 202 has been provided. The semiconductor substrate is comprised of a semiconductor material, such as silicon and can be comprised of one or more layers. NMOS and PMOS regions of the semiconductor substrate are defined. The NMOS regions are targeted for formation of NMOS devices and the PMOS regions are targeted for formation of PMOS devices. Isolation regions 204 are formed by isolation processing. The isolation structures are comprised of a suitable insulative material, such as silicon dioxide. Some examples of suitable isolation structures include LOCOS regions, shallow trench isolation (STI) regions and the like.

A gate dielectric layer 206 is shown formed over the semiconductor substrate 202. The gate dielectric layer 206 has a selected thickness and is comprised of a suitable dielectric material, such as silicon dioxide, nitrided silicon dioxide, high-k dielectric materials, and the like.

Figure 2B:
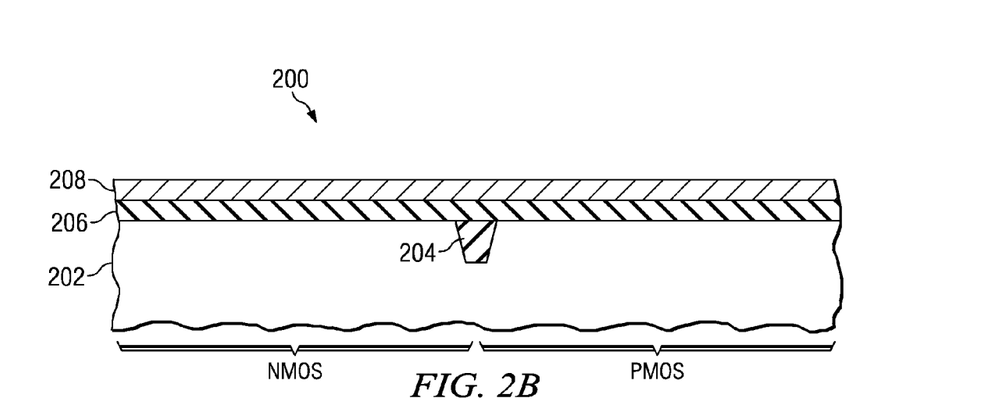

FIG. 2B is another cross sectional view of the device 200 at a stage of fabrication in accordance with an aspect of the present invention. An n-type metal stress inducing layer 208 is formed over the gate dielectric layer 206, in this example. The n-type metal stress inducing layer 208 is comprised of a metal material that typically has a lower work function, and, as a consequence, readily gives up electrons. Additionally, the metal material can be selected so as to resist altering of its work function at high temperatures. The n-type metal stress inducing layer 208 is formed by a suitable deposition process, such as physical vapor deposition (PVD), chemical vapor deposition (CVD), sputtering, atomic layer deposition (ALD), and the like. Further, the n-type metal layer 208 can comprise one or more individual layers. The stress induced by the metal layer is a function of a number of parameters including, but not limited to, deposition process, deposition process parameters, precursor, thickness, composition, and the like. Generally, the n-type metal layer 208 is formed so as to induce tensile stress in underlying channel regions of the NMOS region.

Figure 2C:
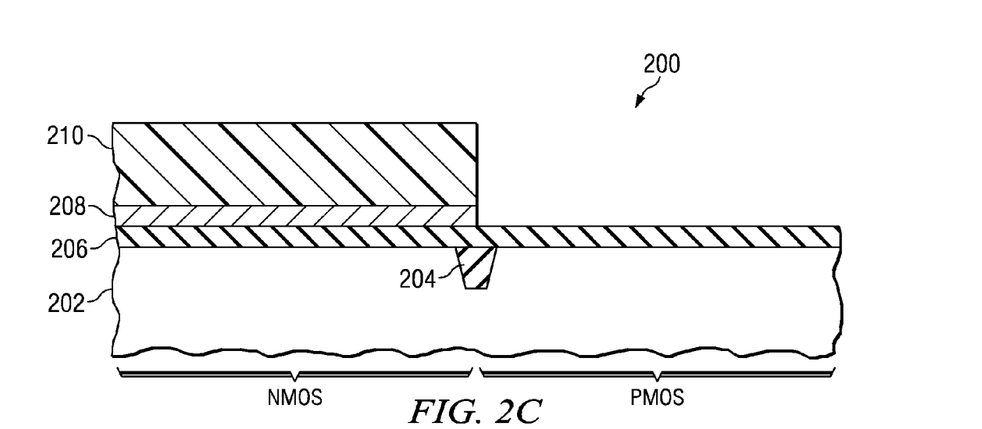

FIG. 2C is yet another cross sectional view of the device 200 at a stage of fabrication in accordance with an aspect of the present invention. A resist mask 210 is selective formed that exposes the PMOS region. The resist mask 210 is employed by a patterning process to remove a portion of the n-type metal stress inducing layer 208 from the PMOS region. Thereafter, the resist mask 210 is removed by, for example, an ash process.

Figure 2D:
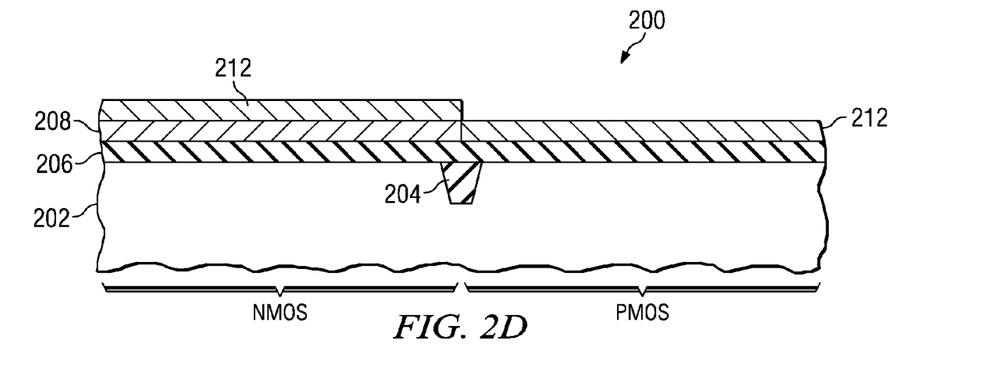

FIG. 2D is another cross sectional view of the device 200 at a stage of fabrication in accordance with an aspect of the present invention. Here, a p-type metal stress inducing layer 212 is formed over the gate dielectric layer 206 and the n-type metal stress inducing layer 208.

The p-type metal stress inducing layer 212 is comprised of a metal material that typically has a higher work function, and, as a consequence, does not readily gives up electrons. Additionally, the metal material can be selected so as to resist altering of its work function at high temperatures. The p-type metal stress inducing layer 212 is formed by a suitable deposition process, such as physical vapor deposition (PVD), chemical vapor deposition (CVD), sputtering, atomic layer deposition (ALD), and the like. Further, the p-type metal layer 212 can comprise one or more individual layers. The stress induced by the metal layer is a function of a number of parameters including, but not limited to, deposition process, deposition process parameters, precursor, thickness, composition, and the like. Generally, the p-type metal layer 212 is formed so as to induce compressive stress in underlying channel regions of the PMOS region.

Figure 2E:
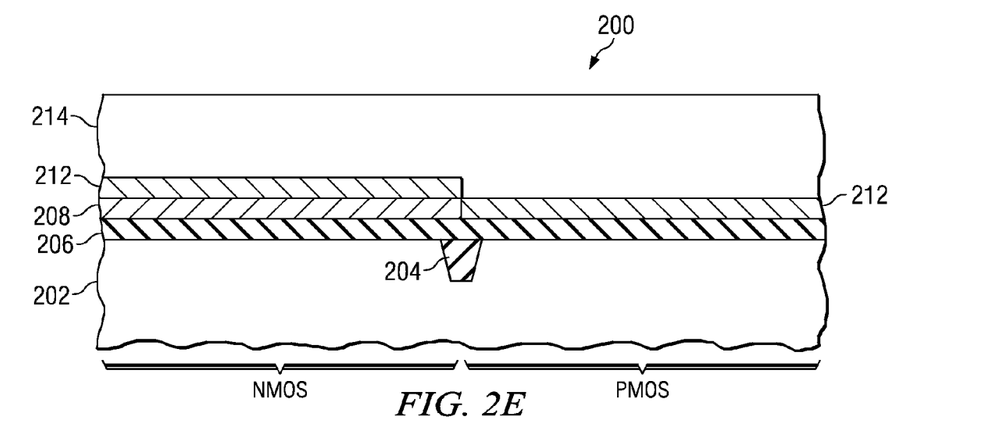

FIG. 2E is yet another cross sectional view of the device 200 at a stage of fabrication in accordance with an aspect of the present invention. Here, a polysilicon layer 214 is formed over the p-type metal layer 212. The polysilicon layer is deposited by a suitable deposition process process.

Figure 2F:
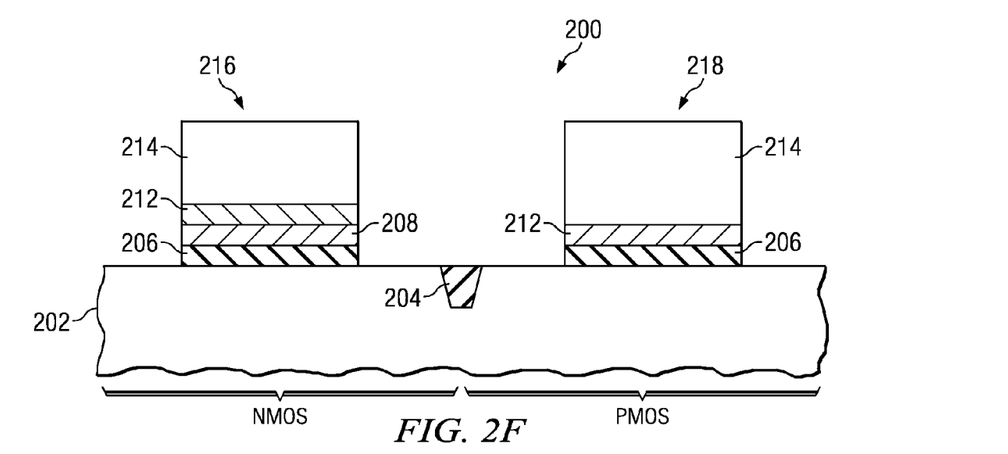

FIG. 2F is another cross sectional view of the device 200 at a stage of fabrication in accordance with an aspect of the present invention. A patterning process is performed to form NMOS and PMOS gate structures 216, 218. The patterning process selectively removes portions of the polysilicon layer 214, the p-type metal stress inducing layer 212 and the n-type metal stress inducing layer 208 within the NMOS region and the polysilicon layer 214 and p-type metal stress inducing layer within the PMOS region. Within the NMOS region, the NMOS gate structures/electrodes 216 comprise the n-type metal stress inducing layer 208, the p-type metal stress inducing layer 212, and the polysilicon layer 214. Alternatively, the p-type metal layer 212 could be removed, in which case in FIG. 2F the NMOS structure 216 would include only the n-type layer 208 under the polysilicon layer 214. Within the PMOS region, the PMOS gate structures/electrodes 218 comprise the p-type metal stress inducing layer 212 and the polysilicon layer 214 as gate electrodes.

In addition, although the embodiments highlighted above discuss single layer metal stress inducing films, metal multilayer stress inducing films may also be employed and are contemplated as falling within the scope of the present invention.

Figure 3:
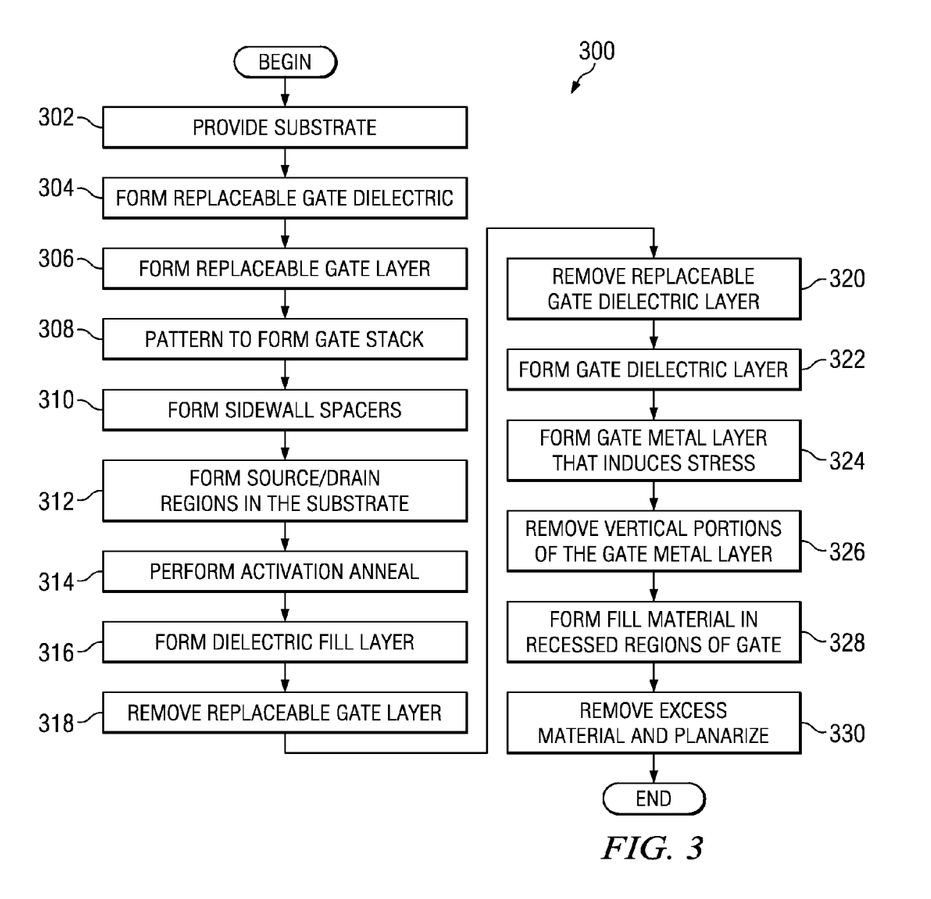
FIG. 3 is a flow diagram illustrating a method of fabricating a replacement gate semiconductor device in accordance with an aspect of the present invention.

Additional layers and structures can also be fabricated. Some examples of the additional layers and/or structures include source/drain regions, lightly doped drain regions (LDD), highly doped drain regions (HDD), activation anneals, sidewall structures or spacers, PMD liners, and the like. replacement gate semiconductor device in accordance with an aspect of the FIG. 3 is a flow diagram illustrating a method 300 of fabricating a present invention. The method 300 forms a device with a replaceable gate and then, after forming source/drain regions and annealing, removes the replaceable gate and forms a replacement gate structure that includes a stress inducing metal layer. While the exemplary method 300 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

The method 300 begins at block 302, wherein a semiconductor substrate is provided. The substrate is comprised of a semiconductor material, such as silicon. Additionally, isolation structures are typically formed by performing isolation processing. Some examples of suitable isolation structures include LOCOS regions, shallow trench isolation (STI) regions and the like. Additionally, prospective channel regions and/or well regions of the semiconductor substrate may be initially doped to adjust the prospective transistor work functions, to suppress punch-through, etc.

A replaceable gate dielectric layer is formed over the semiconductor substrate at block 304. The replaceable gate dielectric layer is comprised of a suitable dielectric material, such as silicon dioxide, high-k dielectric materials, and the like. Additionally, the replaceable gate has a selected thickness.

A replaceable gate layer is formed over the replaceable gate dielectric layer at block 306. The replaceable gate layer is formed by depositing a suitable material and is comprised of a material that can be later removed by a suitable etch process. In one example, the replaceable gate layer is comprised of polysilicon.

A gate patterning process is performed at block 308 to form a gate stack. The gate patterning process selectively removes portions of the replaceable gate dielectric layer and the replaceable gate layer to leave a replaceable gate stack comprised of remaining portions of the replaceable gate dielectric layer and the replaceable gate layer. The patterning process can employ a resist mask or other suitable mask to selectively perform the etching.

Sidewall spacers are formed on lateral edges of the replaceable gate stack at block 310. The sidewall spacers are comprised of one or more suitable materials, such as silicon dioxide, nitride, and the like.

Source/drain regions are formed within the substrate at block 312 by implanting a selected dopant. To form n-type source/drain regions, an n type dopant, such as phosphorous, is implanted. P-type source/drain regions can be formed by implanting a dopant such as boron. The replaceable gate stack can be employed to self align the formation of the source/drain regions. Other implants, such as LDD formation implants, and the like can also be performed.

A high temperature activation anneal is performed at block 314 to activate the source/drain regions. The anneal can be performed at a relatively high temperature without impacting yet to be formed metal stress inducing layers, such as by altering their work function. In one example, an activation anneal is performed at a temperature above about 500 degrees Celsius.

A dielectric fill layer is formed over the device leaving a relatively planar surface at block 316. The dielectric fill layer can include one or more individual layers and is comprised of a suitable dielectric material, such as a silicon containing dielectric material. A planarization process can be employed to planarize the surface.

The replaceable gate layer is removed at block 318 by a suitable selective etch process. In one example, the replaceable gate layer is comprised of polysilicon and removed by using $NH_4OH$, which is highly selective to silicon dioxide and silicon-nitride. The replaceable gate dielectric is then removed at block 320 by a suitable etch process. In one example, the replaceable gate dielectric is comprised of silicon dioxide and is removed by HF. Some undercut may occur at lower gate corners. In another alternative embodiment, the gate dielectric is not replaced, but instead is left in its place.

In the instance where the previous gate dielectric is removed, a gate dielectric layer is formed over the device and in a recessed region of the gate stack at block 322. The gate dielectric layer is formed conformally along interior bottom and vertical surfaces of the recessed region. The gate dielectric layer is comprised of a suitable dielectric material, such as silicon dioxide, high-k dielectrics, and the like.

A gate metal layer is formed over the gate dielectric layer at block 324. The gate metal layer is a stress inducing layer that induces stress in an underlying channel region of the substrate. The gate metal layer is formed with a composition that yields a desired work function, which is generally lower for n-type and higher for p-type devices. Additionally, the composition of the gate metal layer is selected and deposited to yield a selected induced stress. The gate metal layer is formed along interior bottom and vertical surfaces of the recessed region of the gate stack to comprise a bottom portion and vertical portions. In one example, the gate metal layer has a thickness of about 5 to 20 nm. This process is performed for one of an NMOS or PMOS device, and this process is then repeated for the other of the NMOS or PMOS device, respectively.

The gate metal layer here is formed after the activation anneal in one embodiment. As a result, the workfunction is not altered or affected by the activation anneal and, for example, the gate metal layer can be formed without regard to the temperature employed in the activation anneal.

The vertical portions of the gate metal layer are removed at block 326. Thus, only the bottom portion of the gate metal layer substantially remains. As a result, device performance can be improved. Alternatively, the vertical portions may be maintained.

A fill material is then formed within the recessed region of the gate stack at block 328. The fill material can be a metal material, polysilicon, SiGe, TiN, and/or other suitable fill materials.

Excess portions of the fill material, the gate metal layer, and the gate dielectric layer are removed at block 330. One or more etch processes and/or planarization processes can be employed to remove the excess material. Other processes, such as metallization formation, capping layer formation, and the like can also be performed to complete fabrication of the device.

It is appreciated that the method 300 can be employed for NMOS, PMOS, and CMOS devices. It is also appreciated that variations of the method 300 that include formation of a gate metal layer are also contemplated. For example, the method 300 can be adapted to form NMOS devices with replaced gate metal layers having n-type conductivity and PMOS devices with replaced gate metal layers having p-type conductivity and varied stress inducement.

Figure 4A:
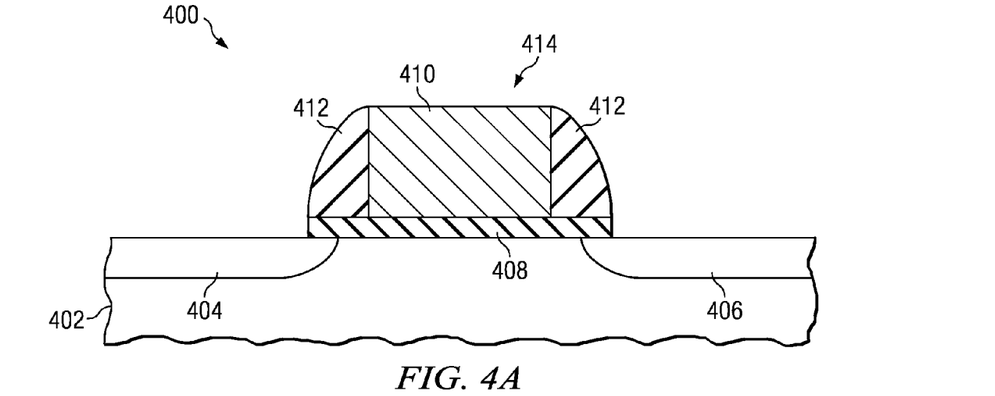
FIGS. 4A to 4D illustrate example stages of fabrication of a replacement gate device fabricated in accordance with an aspect of the present invention
Figure 4B:
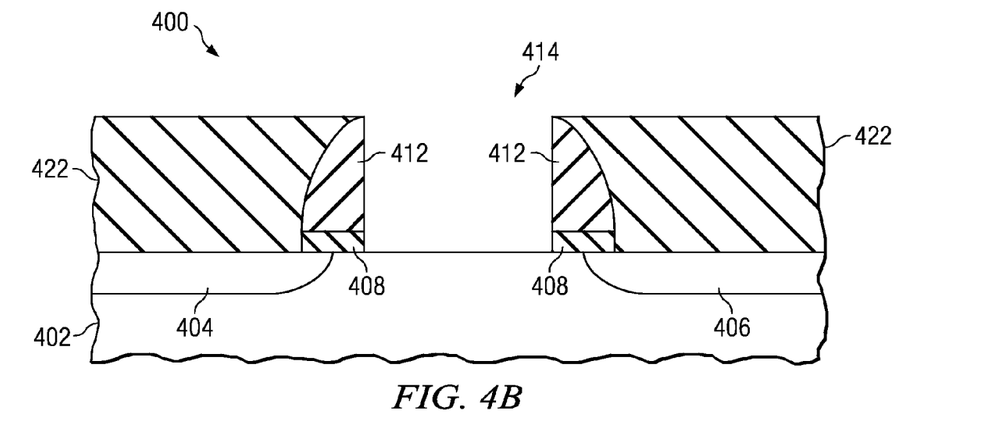

FIGS. 4A and 4B illustrate example stages of fabrication of a replacement gate device 400 fabricated in accordance with an aspect of the present invention. The device 400 can, for example, be fabricated at least partially according to the method 300 of FIG. 3 and/or variations thereof. The figures are provided as an example and for illustrative purposes.

FIG. 4A is a cross sectional view of the device 400 at a stage of fabrication in accordance with an aspect of the present invention. The device 400 includes a semiconductor substrate 402. The substrate 402 is comprised of a semiconductor material, such as silicon. Isolation structures (not shown) can be formed by isolation processing. Some examples of suitable isolation structures include LOCOS regions, shallow trench isolation (STI) regions and the like. Additionally, prospective channel regions and/or well regions of the semiconductor substrate 402 may be initially doped to adjust the prospective transistor work functions, to suppress punch-through, etc.

A replaceable gate dielectric layer 408 is formed over the semiconductor substrate 402. The replaceable gate dielectric layer 408 is comprised of a suitable dielectric material, such as silicon dioxide, high-k dielectric materials, and the like. Additionally, the replaceable gate dielectric layer 408 has a selected thickness. A replaceable gate layer 410 is formed over the replaceable gate dielectric layer 408. The replaceable gate layer 410 is formed by depositing a suitable material and is comprised of a material that can be later removed by a suitable etch process. In one example, the replaceable gate layer 410 is comprised of polysilicon.

The replaceable gate layer 410 is patterned to define a replacement gate structure 414. Sidewall spacers 412 are formed on lateral edges of the gate structure 414. The sidewall spacers 412 are comprised of one or more suitable materials, such as silicon dioxide, nitride, and the like.

Source/drain regions 404, 406 are formed within the substrate 402 by implanting a selected dopant. To form n-type source/drain regions, an n type dopant, such as phosphorus, is implanted. P-type source/drain regions can be formed by implanting a dopant such as boron. The replaceable gate stack 414 can be employed to self align the formation of the source/drain regions. Other implants, LDD formation implants, and the like can also be performed.

An activation anneal is typically performed to activate the source/drain regions. The anneal can be performed at a relatively high temperature without impacting yet to be formed metal stress inducing layers. In one example, an activation anneal is performed at a temperature above about 1,000 degrees Celsius.

In FIG. 4B a dielectric fill layer 422 is deposited and planarized down to the gate structure 414. The dielectric fill layer 422 can be a premetal dielectric layer or other type layer. The dielectric fill layer can include one or more individual layers and is comprised of a suitable dielectric material, such as a silicon containing dielectric material.

The replaceable gate layer 410 is then removed via a suitable selective etch process. In one example, the replaceable gate layer 410 is comprised of polysilicon and removed by using $NH_4OH$, which is highly selective to silicon dioxide and silicon-nitride. The replaceable gate dielectric 408 is at least partially removed by a suitable etch process. In one example, the replaceable gate dielectric 408 is comprised of silicon dioxide and is removed by HF. Some undercut may occur at lower gate corners.

Figure 4C:
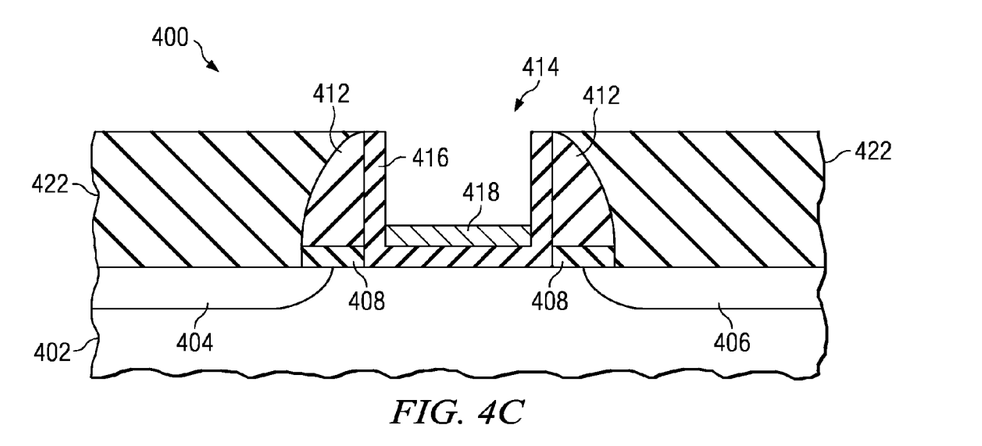

As illustrated in FIG. 4C a gate dielectric layer 416 is formed over the device 400 and in a recessed region where the replaceable gate layer 410 and the replaceable gate dielectric have been removed. The gate dielectric layer 416, in one example, is formed conformally along interior bottom and vertical surfaces of the recessed region. The gate dielectric layer is comprised of a suitable dielectric material, such as silicon dioxide, nitrided silicon dioxide, high-k dielectrics, and the like.

A gate metal layer 418 is formed over the gate dielectric layer 416. The gate metal layer 418 is a stress inducing layer that induces stress in an underlying channel region of the substrate. The gate metal layer 418 is typically formed with a composition that yields a desired work function, which is generally lower for n-type and higher for p-type devices. Additionally, the composition of the gate metal layer 418 is selected and deposited to yield a selected induced stress. The gate metal layer 418 is formed along interior bottom and vertical surfaces of the recessed region of the gate stack to comprise a bottom portion and vertical portions. However, vertical portions of the gate metal layer 418 have been removed to facilitate performance in the illustrated example, however, they may be maintained. In an alternative embodiment of the invention, a first metal layer may be employed to set the work function, while a second layer or layers are provided to generate the desired stress in the channel.

The gate metal layer 418 is formed after the activation anneal. As a result, its workfunction is not altered or affected by the activation anneal and, for example, the gate metal layer can be formed without regard to the temperature employed in the activation anneal.

Figure 4D:
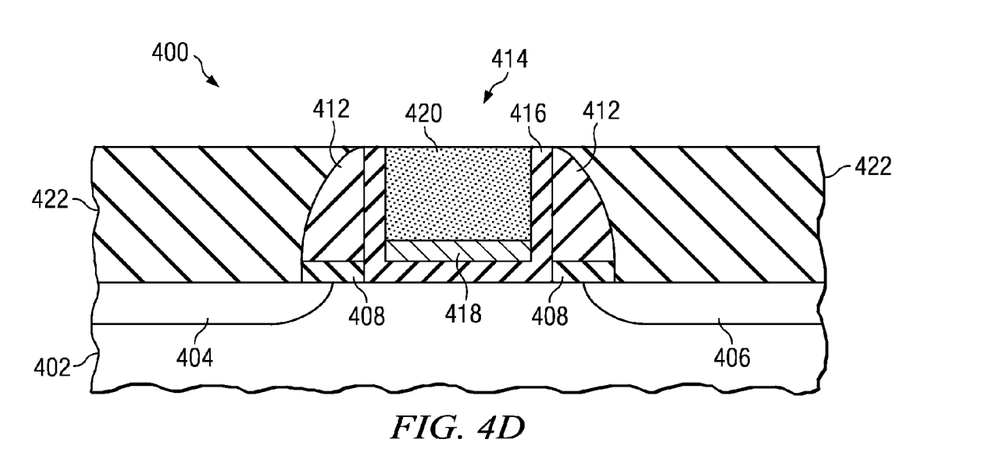

As illustrated in FIG. 4D, a fill layer 420 is formed within the recessed region of the gate stack 414. The fill layer 420 can be a metal material, polysilicon, or another suitable material.

Excess portions of the fill material, the gate metal layer, and the gate dielectric layer are removed. One or more etch processes and/or planarization processes can be employed to remove the excess material. Other layers and structures, such as metallization layers, contacts, stress inducing layers, liners, and the like can also be fabricated on the device 400.

It is appreciated that the device 400 shown above is provided as an example to illustrate and facilitate an understanding of the present invention. Suitable variations in the device 400 are contemplated and in accordance with the present invention.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a semiconductor device, the method comprising:
   providing a semiconductor substrate;
   forming a gate dielectric layer over the semiconductor substrate;
   forming a gate metal stress inducing layer over the gate dielectric layer;
   forming an electrically conductive gate electrode layer on the gate metal stress inducing layer;
   patterning the gate metal stress inducing layer and the gate electrode layer to define a gate structure; and
   forming source and drain regions within the semiconductor substrate on opposite sides of the gate structure.

2. The method of fabricating a semiconductor device according to claim 1, wherein forming the gate dielectric layer comprises forming an oxide, a nitrided oxide, or a high-K dielectric layer.

3. The method of fabricating a semiconductor device according to claim 1, wherein forming the gate metal stress inducing layer comprises sputtering a metal material over the gate dielectric layer.

4. The method of fabricating a semiconductor device according to claim 1, wherein forming the gate metal stress inducing layer comprises depositing an n-type metal that induces tensile stress into an underlying channel region of the substrate.

5. The method of fabricating a semiconductor device according to claim 1, wherein forming the gate metal stress inducing layer comprises depositing a p-type metal that induces compressive stress into an underlying channel region of the substrate.

6. The method of fabricating a semiconductor device according to claim 1, wherein forming the gate metal stress inducing layer comprises depositing metal selected from the group consisting of Al, Ta, Sr, V, Ti, TaC and TiN for an NMOS device, and Ru, W, Co, Pb, Ni, Ir and Pt for a PMOS device.

7. The method of fabricating a semiconductor device according to claim 6, wherein the gate metal stress inducing layer comprises a multi-layer.

8. The method of fabricating a semiconductor device according to claim 1, wherein forming the gate electrode layer comprises depositing polysilicon.

9. The method of fabricating a semiconductor device according to claim 1, wherein forming the gate electrode layer comprises forming a second metal layer.

10. The method of fabricating a semiconductor device according to claim 1, further comprising performing an activation anneal after forming the source and drain regions.

11. The method of fabricating a semiconductor device according to claim 10, wherein the activation anneal is performed at a temperature of about 500 degrees Celsius.

12. The method of fabricating a semiconductor device according to claim 10, wherein the activation anneal is performed at a temperature that maintains an as deposited workfunction of the gate metal stress inducing layer.

13. The method of fabricating a semiconductor device according to claim 1, further comprising forming a stress inducing liner over the semiconductor device.

14. The method of fabricating a semiconductor device according to claim 1, further comprising forming sidewalls on lateral edges of the gate structure prior to forming the source and drain regions.

15. A method of fabricating a semiconductor device, the method comprising:
    providing a semiconductor substrate;
    defining a first region of the semiconductor substrate for a first type conductivity and a second region of the semiconductor substrate for a second type conductivity;
    forming a gate dielectric layer over the semiconductor substrate;
    forming a first metal stress inducing layer over the gate dielectric layer within the first region;
    forming a second metal stress inducing layer over the gate dielectric layer within the second region;
    forming a gate layer over the first metal stress inducing layer and the second metal stress inducing layer; and
    patterning the gate layer, the first metal stress inducing layer, and the second metal stress inducing layer to form first gate structures in the first region and second gate structures in the second region.

16. The method of fabricating a semiconductor device according to claim 15, further comprising forming sidewall spacers on lateral edges of the first gate structures and the second gate structures.

17. The method of fabricating a semiconductor device according to claim 16, further comprising forming source/drain regions having the first type conductivity within the first region and source/drain regions having the second type conductivity within the second region.

18. The method of fabricating a semiconductor device according to claim 17, wherein the first type conductivity is n-type and the second type conductivity is p-type.

19. The method of fabricating a semiconductor device according to claim 17, wherein the first type conductivity is p-type and the second conductivity type is n-type.

20. The method of fabricating a semiconductor device according to claim 15, wherein forming the gate layer comprises depositing polysilicon.

21. The method of fabricating a semiconductor device according to claim 15, wherein the first metal stress inducing layer induces tensile or compressive stress.

22. The method of fabricating a semiconductor device according to claim 15, wherein the first or second metal stress inducing layer comprises a multi-layer.

23. A method of fabricating a semiconductor device, the method comprising:
    forming a replaceable gate dielectric layer over a semiconductor substrate;
    forming a replaceable gate layer over the replaceable gate dielectric layer;
    patterning the replaceable gate layer to form a gate structure;
    forming source/drain regions within the semiconductor substrate;
    forming a planarized dielectric fill layer over the semiconductor device;
    removing the replaceable gate layer from the gate structure;
    forming a gate metal stress inducing layer on interior bottom and vertical surfaces of the gate structure; and
    removing vertical portions of the gate metal stress inducing layer.

24. The method of fabricating a semiconductor device according to claim 23, further comprising removing a portion of the replaceable gate dielectric layer within the gate structure and forming a gate dielectric layer prior to forming the gate metal stress inducing layer.

25. The method of fabricating a semiconductor device according to claim 23, further comprising forming a fill layer over the gate metal stress inducing layer.

26. The method of fabricating a semiconductor device according to claim 23, further comprising performing an activation anneal prior to forming the gate metal stress inducing layer.

27. The method of fabricating a semiconductor device according to claim 23, wherein forming the replaceable gate layer comprises depositing polysilicon.

28. The method of fabricating a semiconductor device according to claim 23, wherein the gate metal stress inducing layer comprises an n-type metal material and induces tensile stress.

29. The method of fabricating a semiconductor device according to claim 23, wherein the gate metal stress inducing layer comprises an p-type metal material and induces compressive stress.

* * * * *